United States Patent [19]

Göckler

[11] Patent Number: 4,953,118
[45] Date of Patent: Aug. 28, 1990

[54] NONRECURSIVE HALF-BAND FILTER

[75] Inventor: Heinz Göckler, Backnang, Fed. Rep. of Germany

[73] Assignee: ANT Nachrichtentechnik GmbH, Backnang, Fed. Rep. of Germany

[21] Appl. No.: 156,797

[22] Filed: Feb. 17, 1988

[30] Foreign Application Priority Data

Feb. 19, 1987 [DE] Fed. Rep. of Germany ....... 3705209

[51] Int. Cl.⁵ ............................................. G06F 15/31
[52] U.S. Cl. ............................ 364/724.01; 364/724.13; 364/724.16
[58] Field of Search ...................... 364/724.13, 724.10, 364/724.16, 724.01

[56] References Cited

U.S. PATENT DOCUMENTS

| 4,344,149 | 8/1982 | van de Meeberg et al. | 364/724.1 |
| 4,388,693 | 6/1983 | Nakayama | 364/724.01 |
| 4,423,488 | 12/1983 | Campbell | 364/724.18 |
| 4,460,890 | 7/1984 | Busby | 364/724.1 X |
| 4,521,866 | 6/1985 | Petit et al. | 364/724.1 |
| 4,701,956 | 10/1987 | Katoh | 364/724.13 X |
| 4,725,972 | 2/1988 | Göckler | 364/724.1 |
| 4,777,612 | 10/1988 | Tomimitsu | 364/724.13 |
| 4,896,320 | 1/1990 | Göckler | 364/724.1 |

OTHER PUBLICATIONS

Bellanger et al., "Interpolation, Extrapolation, and Reduction of Computation Speed in Digital Filters," IEEE Transactions on Acoustics, Speech, and Signal Processing, vol. ASSP-22, No. 4 (Aug. 1974), pp. 231–235.
Stearns, "Digital Signal Analysis" (1975), pp. 102–121.

Primary Examiner—Gary V. Harkcom
Assistant Examiner—Tan V. Mai
Attorney, Agent, or Firm—Spencer & Frank

[57] ABSTRACT

A nonrecursive half-band filter which permits the conversion of a complex-value input signal into a complex-value output signal. The pulse response of the filter is modulated onto a complex carrier at a frequency of $\frac{1}{4}$ or $\frac{3}{4}$ of the sampling rate, the zero phase of this frequency is a whole multiple of $\pi/2$, and the sampling rate is halved. Another embodiment of the filter also permits the conversion of a complex-value input signal into a complex-value output signal. In the second embodiment the pulse response is modulated onto a complex carrier of a frequency of one-half the input sampling rate, the zero phase of this frequency is a whole number multiple of $\pi/2$, and the sampling rate is doubled.

12 Claims, 5 Drawing Sheets $T = 1/f_A$

NONRECURSIVE HALF-BAND FILTER

BACKGROUND OF THE INVENTION

The present invention relates to a nonrecursive half-band filter. A half-band filter exhibits an amplitude frequency response which is symmetrical with respect to the 50%-attenuation point occurring at a quarter of the sampling rate fA (see FIG. 2A).

Nonrecursive digital filters are discussed in general by Samuel D. Stearns, "Digital Signal Analysis," chapter 8 (entitled "Nonrecursive Digital Systems," pages 102–119), 1975. Furthermore nonrecursive half-band filters are disclosed by Maurice G. Bellanger et al in an article entitled "Interpolation, Extrapolation, and Reduction of Computation Speed in Digital Filters," IEEE Transactions on Acoustics, Speech and Signal Processing, Volume ASSP-22, No. 4, August 1974, pages 231–235. These prior half-band filters process real input signals into real output signals.

SUMMARY OF THE INVENTION

It is an object of the present invention to provide a nonrecursive half-band filter which permits the conversion of a complex input signal into a complex output signal in an inexpensive manner.

In accordance with one aspect of the invention, this object can be attained by providing a nonrecursive half-band filter which is characterized in that its complex-valued input signal $\bar{s}_1k(T) = s_{1r} + js_{1i}$ is converted into a complex output signal $\bar{s}(2kT)$, where k is a running index, by cutting in half the sampling rate $fA = 1/T$ and folding as follows:

$$\begin{aligned} \bar{s}(2kT) &= \bar{s}_1(2kT) * \bar{h}(l) \\ &= s_{1r}(2k) * h_r(l) - s_{1i}(2k) * h_i(l) + \\ &\quad j[s_{1r}(2k) * h_i(l) + s_{1i}(2k) * h_r(l)] \end{aligned}$$

in that its pulse response h(l), where $l = -(N-1)/2$ to $(N-1)/2$ and the filter length N is an odd integer, is modulated onto the complex carrier of a frequency of $+\frac{1}{4}$ of the sampling rate $fA = 1/T$ to produce $$\bar{h}(l) = h(l) \cdot e^{j(\pm 2\pi lfA/(4fA) + \phi 0)} = j^{\pm 1l} \cdot e^{j\phi 0} \cdot h(l)$$

and the zero phase $\phi 0$ of this frequency is a whole number multiple m of $\pi/2$ ($\rho 0 = m \cdot \pi/2$, where m = 0, 1, 2, 3, ...). This modulation process effects a frequency shift by the carrier frequency.

In accordance with another aspect of the invention, the foregoing object can also be attained by providing a nonrecursive half-band filter wherein its complex input signal $\bar{s}(2kT)$, where k is a running index, is converted into a complex output signal $\bar{s}_2(kT)$ with doubling of the sampling rate $fA' = \frac{1}{2}T$ and folding as follows:

$$\begin{aligned} \bar{s}_1(kT) &= \bar{s}(2kT) * \bar{h}(l) \\ &= s_r(2k) * h_r(l) - s_i(2k) * h_i(l) + \\ &\quad j[s_r(2k) * h_i(l) - s_i(2k) * h_r(l)] \end{aligned}$$

in that its pulse response h(l) with respect to the increased sampling rate $fA = 2fA'$, where $l = -(N-1)/2$ to $(N-1)/2$ and the filter length N is an odd integer, is modulated onto the complex carrier of a frequency $\pm fA/4 = fA'/2$ to produce $$\bar{h}(l) = h(l) \cdot e^{j(\pm 2\pi lfA/(4fA) + \phi 0)} = j^{\pm 1l} \cdot e^{j\phi 0} \cdot h(l)$$

and the zero phase $\theta 0$ of this frequency is a whole number multiple m of $\pi/2$ ($\phi 0 = m \cdot \pi/2$, where m = 0, 1, 2, 3, ...).

The nonrecursive half-band filter according to the invention permits the conversion of complex digital input signals into complex digital output signals with simultaneous reduction of the sampling rate by a factor of 2 and the conversion of complex digital input signals into complex digital output signals with simultaneous increase in the sampling rate by a factor of 2. This relatively inexpensive half-band filter is thus suitable as a digital pre-filter or post-filter for digital systems processing complex signals and as a digital partial filter in an arrangement of anti-aliasing filters for bandwidth limitation according to the sampling theorem. The advantage of the half-band filter is its linear phase and the concomitant low expenditures, with it being possible in each case to employ the minimum possible sampling rate required according to the sampling theorem.

DESCRIPTION OF THE PREFERRED EMBODIMENTS

Figure 1:
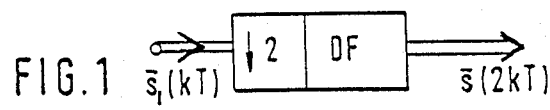
FIG. 1 is a block diagram of a digital filter according to an aspect of the invention.

In FIG. 1, a complex-valued input signal $\bar{s}_1(kT)$ is fed to a digital half-band filter DF by cutting the sampling rate of the input signal $\bar{s}_1$ in half, as will be explained in more detail hereafter. Half-band filter DF then produces from it the complex output signal $\bar{s}(2kT)$, which has a sampling rate half that of the input signal. In FIG. 1 an arrow and the number "2" are illustrated at the input side of filter DF to represent the reduction of the sampling rate, and do not imply additional signal processing between the input signal $\bar{s}_1$ and filter DF. As is indicated in FIG. 1, the sampling period T of the input signal $\bar{s}_1$ is the reciprocal of the sampling rate fA of the input signal. In German application P 36 21 737 a nonrecursive half-band filter is described which performs the conversion of a real input signal into a complex output signal and vice versa.

Figure 2A:
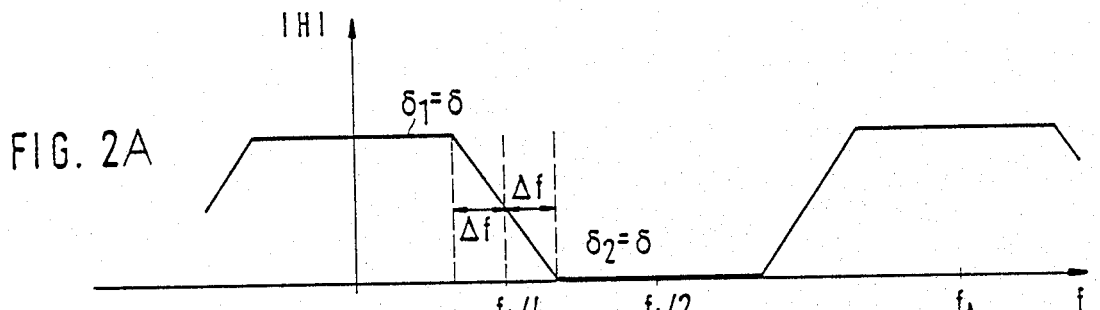
FIGS. 2A to 2C show some amplitude responses of halfband filters plotted over the frequency.

FIG. 2A shows the amplitude-frequency response of a prototype half-band filter. Its transmission range extends from $-fA/4+\Delta f$ to $+fA/4-\Delta f$ (where $\pm fA/4$ represents the frequency at which the attenuation is 50%), and its blocking range likewise has a width of $fA/2-2\Delta f$. It is also characteristic for the half-band filter that the transition from the blocking to the transmission range is gradual and takes place over a width of $2\Delta f$. This transition region is arranged to be symmetrical with respect to $fA/4$. A further characteristic of the half-band filter is that its ripple is identical in the transmission range and in the blocking range, namely $\delta 1=\beta 2=\delta$. In such a filter, a pulse response h(l) results where $l=-(N-\Delta)/2$ to $N-1/2$ and the filter length N is an odd integer. It further results that every second value equals zero, except for the mean major value (see in this connection also FIG. 2 at page 233 of the cited article by Bellanger et al). Filter length N is defined by the number of coefficients, including those of zero value. The magnitude (amplitude) transmission in the passband is restricted to $1\pm\delta$ $1=1\pm\delta$ and is restricted to $\pm\beta 2=\pm\delta$ in the blocking range. The prototype filter is a half-band filter with real coefficients as described in the Bellanger et al. article mentioned in the "Background of the Invention" portion of this application, from which the half-band filter with complex coefficients (complex half-band filter) is derived.

Figure 2B:
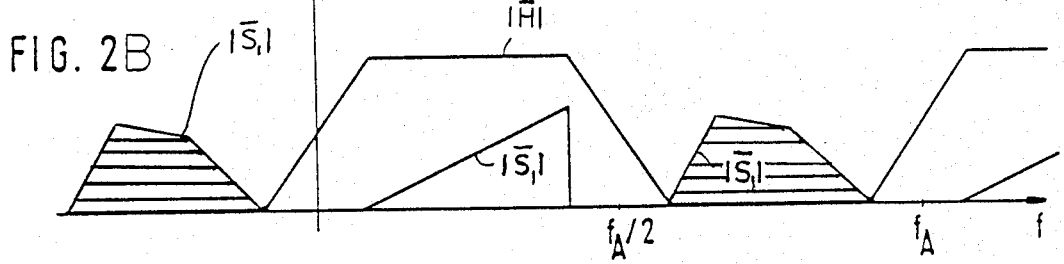
Figure 2C:
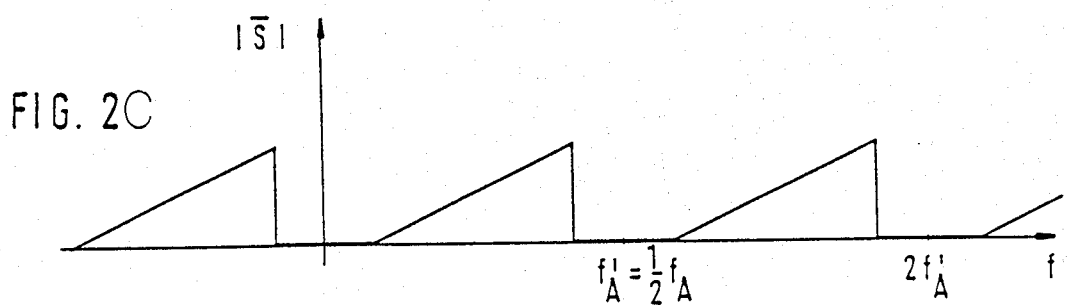

FIG. 2B shows the frequency curve $\bar{H}$ for the complex half-band filter. It can be seen that this frequency curve is shifted to the right by the frequency $fA/4$ with respect to the frequency curve of the prototype half-band filter. FIG. 2B additionally shows the spectrum $|\bar{S}_1|$ of a complex input signal $\bar{s}_1$ (kT) sampled at a sampling rate fA. This spectrum, due to sampling at fA, is periodically repeated in frequency ranges $[\rho\cdot fA, (\rho+1)\cdot fA]$, where $\rho=\ldots,-1,0,+1,\ldots$ is any integer. Without a change in the sampling rate, the half-band filter according to the invention would thus suppress the spectral components of $\bar{s}_1$ kT) between fA/2 and fA and of course all repetitions. Cutting the sampling rate in half produces the desired spectra which are each repeated in a pattern of $fA/2=fA'$, i.e. at the new sampling rate An example of the spectra when the sampling rate is cut in half in accordance with the present invention is shown in FIG. 2C. $|H|$ and $|\bar{H}|$ are the amplitude frequent response of the half-band filter with real coefficients or with complex coefficients, respectively. $|\bar{S}|$ is the magnitude of the spectrum of the complex output signal of the complex half-band filter.

At this point, it should be noted that the other spectral component (that is, the dashed part of FIG. 2B) of the complex input signal $\bar{s}_1$ (kT) is obtained at the output of the half-band filter if the frequency curve of the prototype half-band filter according to FIG. 2A is shifted by $-fA/4$ or, which is equivalent, by $+3fA/4$.

Figure 3:
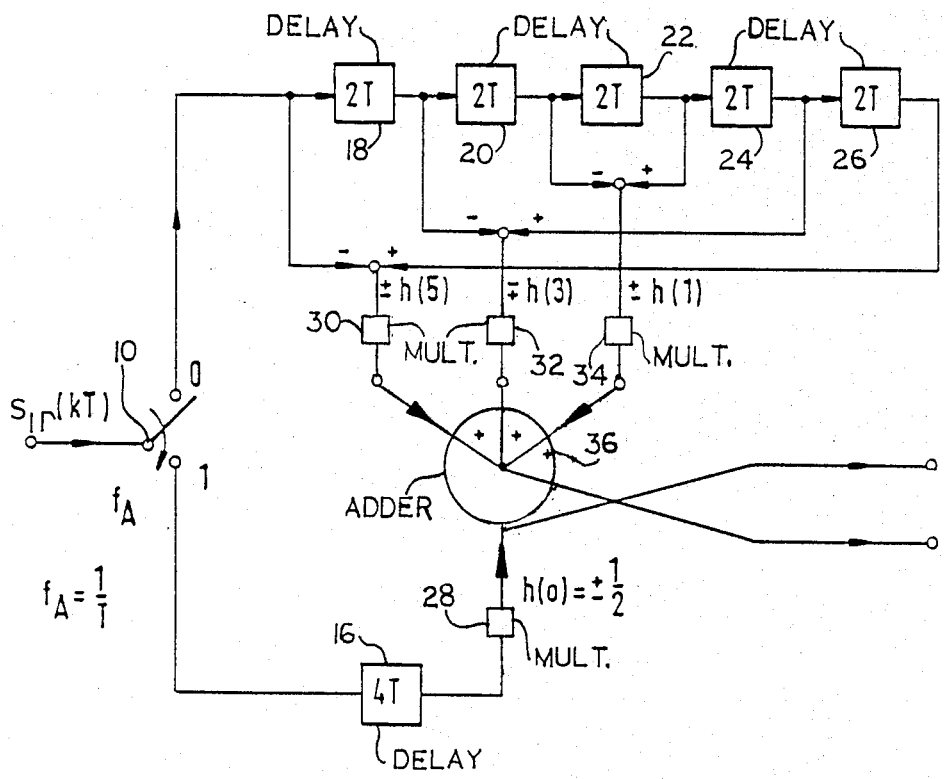
FIGS. 3 and 4 show particularly favorable circuit variations for a half-band filter in accordance with the embodiment of FIG. 1.

FIG. 3 now shows a detailed embodiment of a half-band filter according to the invention. At first, however, a few words regarding FIG. 2C, according to which the sampling rate was cut in half only after filtering. This sequence of proceeding should be formally followed, but, according to the invention, it is also possible to divide the half-band filter component into two branches for processing the real component and the imaginary component. These two branches are supplied right from the start with every second sampling value of the input signal. But this means nothing other than that, as also shown in the block diagram of FIG. 1, the sampling rate can be cut in half directly at the filter input. Correspondingly the detailed circuit diagrams of FIGS. 3 and 4 have a demultiplexer switch at the input which supplies, on one hand, the upper branch and, on the other hand, the lower branch, each in the rhythm of the sampling rate $fA' = fA/2$. Reference numbers 10, 12, and 14 in FIGS. 3 and 4 identify these demultiplexer switches.

Figure 4:
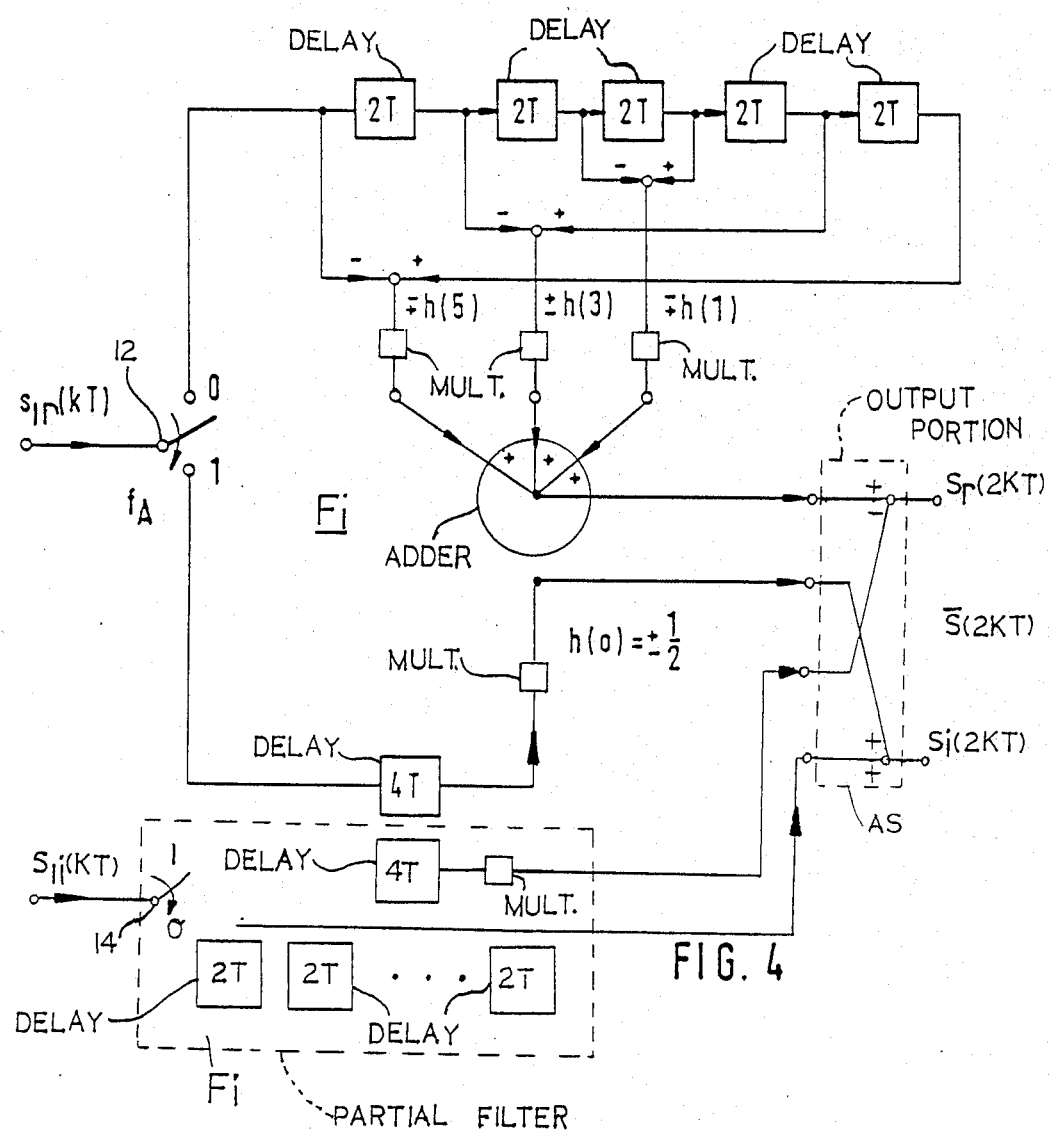

FIG. 3 as well as FIG. 4 show examples of a realization for a filter length of N=11. In FIG. 3 the demultiplexer switch 10 cuts the sample rate fA of the real part $s_{1r}$ (kT) of the input signal in half as previously discussed, so that the upper and lower branches shown in FIG. 3 receive alternate samples of the input signal. It will be apparent that each branch receives samples at the rate fA/2. The lower branch includes a delay member 16 for a delay $(N-3)$ T/2=4T, while the upper branch includes a chain of five delay members 18, 20, 22, 24, and 26 each having a delay of 2T. FIG. 3, which, by the way, shows only one of the two identical filter parts required for processing the real component and the imaginary component, depicts two realizations, namely for modulation phase angles $\phi 0=0$ and $\phi 0=\pi$ corresponding to m=0 and m=2.

The output signal of the delay member 16 of the lower branch is weighted (multiplied) with $h(0)=\frac{1}{2}$ at multiplier 28 and then produces one contribution to the real component $s_r(2kT)$ of the output signal. For m=2, the weighing is $-\frac{1}{2}$. The further processing of the upper branch is such that $(N+1)/4=3$ difference signals are formed:

first difference signal = difference between the input signal to the first delay member 18 and the output signal from the last delay member 26;

second difference signal = difference between the input signal to the second delay member 20 and the output signal from the penultimate delay member 24; and third difference signal = difference between the input signal to the third delay member 22 and the output signal from the third-last, i.e. the middle, delay member 22.

Then these difference signals are weighted by multipliers 30, 32, and 34, and then summed by adder 36 to provide a contribution to the imaginary component of the output signal $\bar{s}(2kT)$. The weighing is effected according to the following tables.

Examples for N=11 and $h(-l)=h(l)$ for $l=0, 1, \ldots 5$, corresponding to the prototype half-band filter according to the frequency curve of FIG. 2A:

TABLE 1

| m = 0 (m = 2 with respectively reversed sign for the complex coefficients $h = \text{Re}(h) + j\text{Im}(h)$) | | | | | | |
|---|---|---|---|---|---|---|
| l | −5 | −3 | −1 | 0 | 1 | 3 | 5 |
| Re($\bar{h}$) | 0 | 0 | 0 | h(0) | 0 | 0 | 0 |
| Jm($\bar{h}$) | −h(5) | h(3) | −h(1) | 0 | h(1) | −h(3) | h(5) |

TABLE 2

| m = 1 (m = 3 with respectively reversed sign for the complex coefficients) | | | | | | |
|---|---|---|---|---|---|---|
| l | −5 | −3 | −1 | 0 | 1 | 3 | 5 |
| Re($\bar{h}$) | h(5) | −h(3) | h(1) | 0 | −h(1) | h(3) | −h(5) |
| Jm($\bar{h}$) | 0 | 0 | 0 | h(0) | 0 | 0 | 0 |

The realization according to FIG. 4 is effected in the same manner as that according to FIG. 3, with the only difference being the other zero phase value $\phi 0=m\cdot\pi/2$ where m=1 and 3, which merely results in a different weighing and a different exchange of the filter branch outputs.

FIG. 4 shows a complete half-band filter DF (see FIG. 1) having two identical partial filters Fi, with the upper partial filter serving to process the real component $s_{1r}(kT)$ of the input signal and the lower filter serving to process the imaginary component $s_{1i}(kT)$ of the input signal. An output portion AS includes difference forming and summing members to receive the signals processed by the pair of partial filters $F_i$, and furnishes the complex output signal $\bar{s}(2kT)=s_r(2k)+js_i(2k)$. Output portion AS, which is not illustrated in detail in FIG. 4, processes the signals received from the partial filters $F_i$ in accordance with the following equation:

$$\begin{aligned} \bar{s}(2kT) &= s_1(2kT) * h(l) \\ &= s_{1r}(2k) * h_r(l) - s_{1i}(2k) * h_i(l) + \\ &\quad j[s_{1r}(2k) * h_i(l) + s_{1i}(2k) * h_r(l)] \end{aligned}$$

In the above equation, the symbol "*" indicates convolution.

Figure 5:
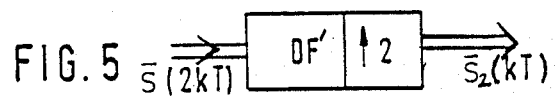
FIG. 5 is a block diagram of a filter according to another aspect of the invention, and illustrates a half-band filter for processing a complex input signal into a complex output signal with a simultaneous increase of the sampling rate by a factor of 2.
Figure 6:
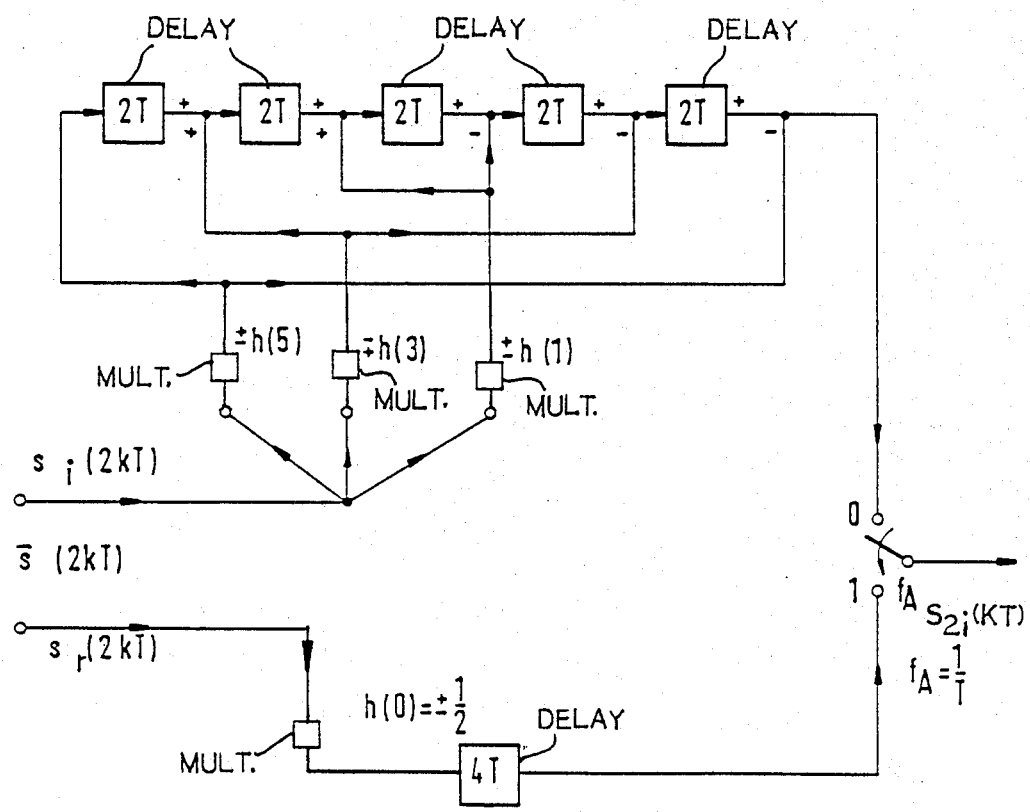
FIG. 6 shows circuit details for the filter according to FIG. 5, with this circuit being developed by transposition from FIG. 3, i.e., by reversal of all arrow directions and substitution of branching members by adders and vice versa and exchange of a demultiplexer for a multiplexer.
Figure 7:
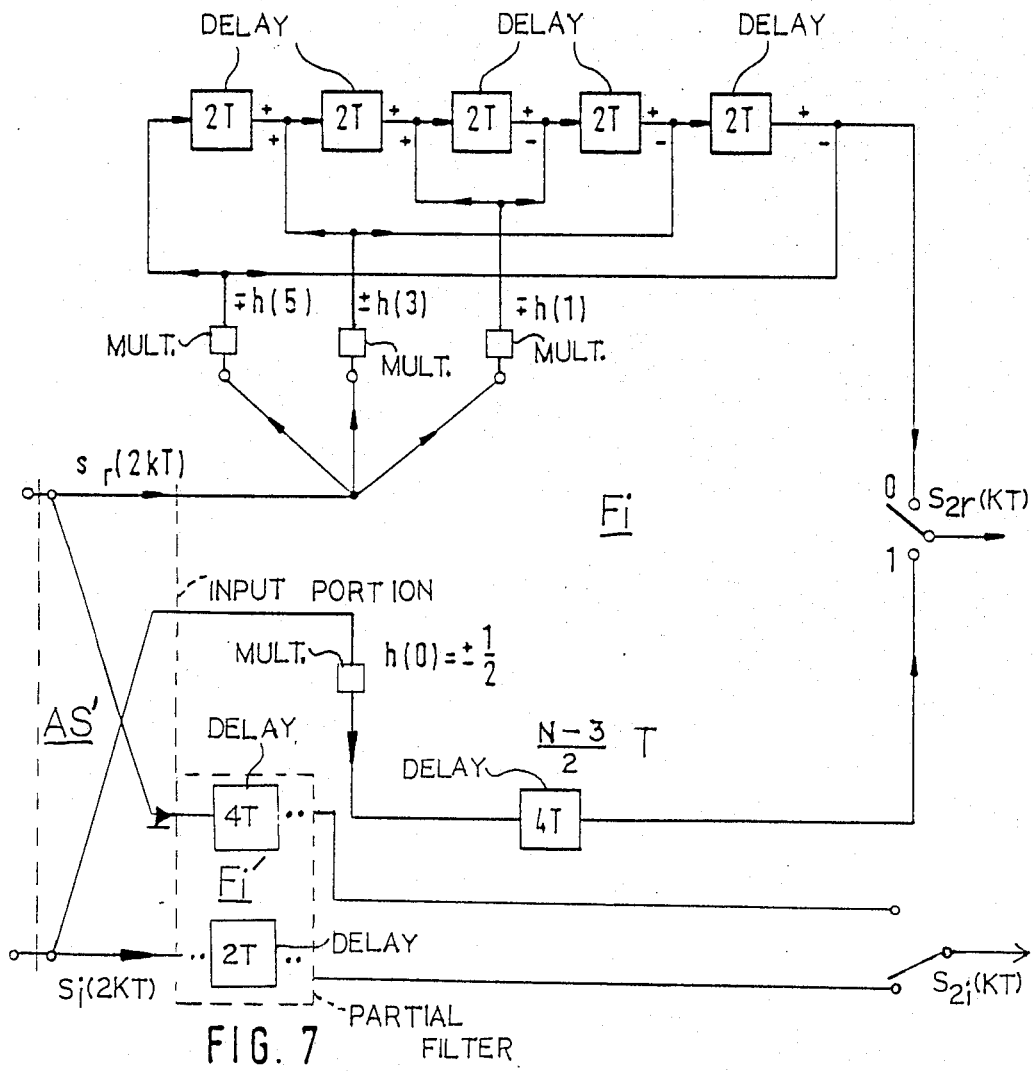
FIG. 7 shows circuit details for another filter according to FIG. 5, with this circuit being developed by transposition from FIG. 4, i.e., by reversal of all arrow directions and substitution of branching members by adders and vice versa and exchange of demultiplexers for multiplexers.

FIG. 5 is a block diagram for the reversed use of the half-band filter of FIG. 1. That is, the filter DF' generates a complex output signal from a complex input signal with an increased sampling rate. The arrow and number "2" at the output end of filter DF' indicates this change in the sampling rate, and does not imply additional signal processing between the filter DF' and the complex output signal. For the purpose of generating a complex output signal from a complex input signal with an increased sampling rate, the above presented circuits must be transposed, resulting in a reversal of all arrow directions and substitution of branching members by adders and vice versa as well as exchange of demultiplexers for multiplexers. Here the term "branching member" does not imply an actual circuit component, but instead refers to a junction whereby an incoming signal is distributed to a plurality of members. It will be apparent that the circuit embodiment of FIG. 6 (where $m=0$; 2 and $N=11$) evolves from FIG. 3 and the circuit of FIG. 7 (where $m=1$; 3 and $N=11$) evolves from FIG. 4. It will be noted that, in FIG. 7, the complex-valued input signal is coupled by an input portion AS' and a pair of partial filters Fi' to four input ports provided by a pair of multiplexer switches, which double the sampling rate of the signals received at their respective input ports. The filtered complex output signal is available at the two output ports of the multiplexer switches.

The present disclosure relates to the subject matter disclosed in Federal Republic of Germany application P 37 05 209.8 of February 19th, 1987, the entire disclosure of which is incorporated herein by reference.

It will be understood that the above description of the present invention is susceptible to various modifications, changes and adaptations, and the same are intended to be comprehended within the meaning and range of equivalents of the appended claims.

What is claimed is:

1. A nonrecursive half-band filter for filtering a complex-valued input signal $\bar{s}_1(kT)=s_{1r}+js_{1i}$, where the input signal has a sampling rate $fA=1/T$ and where k is a running index, the filter having a filter length N and having a pulse response $h(l)$, where N is an odd integer and $l=-(N-1)/2$ to $(N-1)/2$, said filter comprising:

first means for demultiplexing the samples of the input signal to provide a plurality of demultiplexing signals, each demultiplexed signal having a sampling rate of $fA/2$; and second means, receiving the demultiplexing signals, for generating a filtered complex output signal $\bar{s}(2kT)$ in accordance with the following relationship, with the symbol * indicating convolution and with $\bar{h}(l)$ representing a complex value $$\begin{aligned} \bar{s}(2kT) &= s_1(2kT) * h(l) \\ &= s_{1r}(2k) * h_r(l) - s_{1i}(2k) * h_i(l) + \\ &\quad j(s_{1r}(2k) * h_i(l) + s_{1i}(2k) * h_r(l)), \end{aligned}$$

wherein the pulse response $h(l)$ of the filter is modulated onto a complex carrier with a frequency of $\pm\frac{1}{4}$ of the sampling rate $fA$ to produce $$\bar{h}(l)=h(l)\cdot e^{j(\pm 2\pi lfA/(4fA)+\phi 0)}=j^{\pm l}\cdot e^{j\phi 0}\cdot h(l)$$

and the zero phase $\phi 0$ of this frequency is a whole number multiple m of $\pi/2$ ($\phi 0=m\cdot\pi/2$, where $m=0, 1, 2, 3, \ldots$), wherein the plurality of demultiplexed signals includes first and second demultiplexed signals, wherein the first means includes means for forming the first and second demultiplexed signals by allocating every second sample of the real component of the input signal to the first demultiplexed signal and allocating the remaining samples of the real component of the input signal to the second demultiplexed signal, and wherein the second means includes a chain of $(N-1)/2$ delay members each having a delay of 2T, the chain of delay members receiving the first demultiplexed signal, means, receiving signals from the chain of delay members, for forming difference signals, the means for forming difference signals including means for forming a first difference signal equal to the output signal from the last delay member in the chain minus the input signal to the first delay member of the chain, means for forming a second difference signal equal to the output signal from the penultimate delay member of the chain minus the input signal to the second delay member of the chain, and means for forming a third difference signal equal to the output signal from the third delay member from the end of the chain minus the input signal to the third delay member of the chain, means for weighing the difference signals with values $h(l)$ of the pulse response, means for summing the weighted difference signals to provide a contribution to one of the real and the imaginary components of the filtered output signal, a further delay member receiving the second demultiplexed signal, the further delay member having a delay of $T(N-3)/2$, and means for weighing the output signal of the further delay member with the value $h(0)$ to produce a contribution to the other of the real and the imaginary components of the filtered output signal.

2. The filter of claim 1, wherein the plurality of demultiplexed signals further includes third and fourth demultiplexed signals, wherein the first means further comprises means for forming the third and fourth demultiplexed signals by allocating every second sample of the imaginary component of the input signal to the third demultiplexed signal and allocating the remaining samples of the imaginary component of the input signal to the fourth demultiplexed signal, and wherein the second means further comprises an additional chain of $(N-1)/2$ delay members each having a delay of 2T, the additional chain of delay members receiving the third demultiplexed signal;

means, receiving signals from the additional chain of delay members, for forming additional difference signals, the means for forming additional difference signals including means for forming a first additional difference signal equal to the output signal from the last delay member in the additional chain minus the input signal to the first delay member of the additional chain, means for forming a second additional difference signal equal to the output signal from the penultimate delay member of the additional chain minus the input signal to the second delay member of the additional chain, and means for forming a third additional difference signal equal to the output signal from the third delay member from the end of the additional chain minus the input signal to the third delay member of the additional chain;

means for weighing the additional difference signals with values h(l) of the pulse response;

means for summing the weighted additional difference signals to provide an additional contribution to one of the real and the imaginary components of the filtered output signal;

an additional further delay member receiving the fourth demultiplexed signal, the additional further delay member having a delay of $T(N-3)/2$; and means for weighing the output signal of the additional further delay member with the value h(0) to produce an additional contribution to the other of the real and the imaginary components of the filtered output signal.

3. The filter of claim 2, wherein $N=11$ and $m=1$, wherein the first difference signal and the first additional difference signal are weighted with $-h(5)$, wherein the second difference signal and the additional second difference signal are weighted with $h(3)$, wherein the third difference signal and the additional third difference signal are weighted with $-h(1)$, and wherein $h(0)=\frac{1}{2}$.

4. The filter of claim 2, wherein $N=11$ and $m=3$, wherein the first difference signal and the first additional difference signal are weighted with $h(5)$, wherein the second difference signal and the additional second difference signal are weighted with $-h(3)$, wherein the third difference signal and the additional third difference signal are weighted with $h(1)$, and wherein $h(0)=-\frac{1}{2}$.

5. The filter of claim 2, wherein $N=11$ and $m=0$, wherein the first difference signal and the first additional difference signal are weighted with $h(5)$, wherein the second difference signal and the additional second difference signal are weighted with $-h(3)$, wherein the third difference signal and the additional third difference signal are weighted with $h(1)$, and wherein $h(0)=\frac{1}{2}$.

6. The filter of claim 2, wherein $N=11$ and $m=2$, wherein the first difference signal and the first additional difference signal are weighted with $-h(5)$, wherein the second difference signal and the additional second difference signal are weighted with $h(3)$, wherein the third difference signal and the additional third difference signal are weighted with $-h(1)$, and wherein $h(0)=-\frac{1}{2}$.

7. A nonrecursive half-band filter for filtering a complex-valued input signal $\bar{s}(2kT)=s_r+js_i$, where the input signal has a sampling rate $fA'=\frac{1}{2}T$ and where k is a running index, the filter having a filter length N and having a pulse response h(l), where N is an odd integer and $l=-(N-1)/2$ to $(N-1)/2$, said filter comprising:

first means, having first, second, third, and fourth input ports and having first and second output ports, for multiplexing signals received at the first and second input ports to provide a signal at the first output port having a doubled sampling rate of $fA=2fA'$, and for multiplexing signals received at the third and fourth input ports to provide a signal at the second output port having a doubled sampling rate of $fA=2fA'$; and second means, coupling the input signal to the input ports of the first means, for generating at the output ports of the first means a filtered complex signal $\bar{s}_2(kT)$ in accordance with the following relationship, with the symbol * indicating convolution and with h(l) representing a complex value $$s_2(kT) = s(kT) * h(l)$$
$$= s_r(k) * h_r(l) - s_i(k) * h_i(l) +$$
$$j(s_r(k) * h_i(l) + s_i(k) * h_r(l)); \text{ and}$$

wherein the pulse response h(l) of the filter with respect to the double sampling rate fA is modulated onto a complex carrier with a frequency $\pm fA/4 = fA'/2$ to produce $$\bar{h}(l) = h(l) \cdot e^{j(\pm 2\pi l fA/(4fA) + \phi 0)} = j^{\pm l} \cdot e^{j\phi 0} \cdot h(l)$$

and the zero phase 0 of this frequency is a whole number multiple m of $\pi/2$ ($\phi 0 = m \cdot \pi/2$, where $m=0, 1, 2, 3, \ldots$), wherein the second means includes a chain of $(N-1)/2$ delay members each having a delay of 2T;

an additional chain of $(N-1)/2$ delay members each having a delay of 2T;

third means for conveying the real component $s_r(2kT)$ weighted with predetermined values to the chain of delay members to form a difference signal that is received at the first input port of the first means, and for conveying the imaginary component $s_i(2kT)$ weighted with predetermined values to the additional chain of delay members to form an additional differences signal that is received at the fourth input port of the first means;

further delay means for delaying the imaginary component $s_i(2kT)$ weighted with h(0) of the pulse response to generate a signal that is received at the second input port of the first means, the further delay means having a delay of $T(N-3)/2$; and additional further delay means for delaying the real component $s_r(2kT)$ weighted with $-h(0)$ to generate a signal that is applied to the third input port of the first means.

8. The filter of chain 7 wherein in the third means the real component $s_r(2kT)$ weighted with a value h(l) of the pulse response is fed to the first delay member of the chain and is subtracted from the output signal of the last delay member of the chain, and the identically weighted imaginary component $s_i(2kT)$ is fed to the first delay member of the additional chain and subtracting from the output of the last delay member of the additional chain.

9. The filter of claim 8, wherein the first means comprises:
multiplexer means for generating the real component $s_{2r}(kT)$ of the filtered signal by furnishing the difference signal as every second sampling value of the real component and, offset in time, by furnishing the output signal from the further delay means as every second sampling value of the real component; and
additional multiplexer means for generating the imaginary component $s_{2i}(kT)$ of the filtered signal by furnishing the additional difference signal as every second sampling value of the imaginary component and, offset in time, by furnishing the output signal from the additional further delay means as every second sampling value of the imaginary component.

10. The filter of claim 9, wherein m=0, wherein N=11, wherein the delay means has five delay members, and wherein the third means comprises means for conveying the real component $s_r(kT)$ weighted with h(5) to the input of the first delay member of the chain, the real component weighted with −h(3) to the input of the second delay member of the chain, the real component weighted with h(1) to the input of the third delay member of the chain, the real component weighted with −h(1) to the input of the fourth delay member of the chain, the real component weighted with h(3) to the input of the fifth delay member of the chain, and the real component weighted with −h(5) to the output of the fifth delay member of the chain.

11. The filter of claim 10 wherein the third means further comprises means for conveying the imaginary component $s_i(kT)$ weighted with h(5) to the input of the first delay member of the additional chain, the imaginary component weighted with −h(3) to the input of the second delay member of the additional chain, the imaginary component weighted with h(1) to the input of the third delay member of the additional chain, the imaginary component weighted with −h(1) to the input of the fourth delay member of the additional chain, the imaginary component weighted with h(3) to in put of the fifth delay member of the additional chain, and the imaginary component weighted with −h(5) to the output of the fifth delay member of the additional chain.

12. The filter of claim 11, wherein $h(0)=\frac{1}{2}$.

* * * * *